United States Patent
Cao et al.

(10) Patent No.: US 7,514,358 B2
(45) Date of Patent: *Apr. 7, 2009

(54) SEQUENTIAL DEPOSITION OF TANTALUM NITRIDE USING A TANTALUM-CONTAINING PRECURSOR AND A NITROGEN-CONTAINING PRECURSOR

(75) Inventors: Wei Cao, Milpitas, CA (US); Hua Chung, San Jose, CA (US); Vincent Ku, Palo Alto, CA (US); Ling Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 365 days.

This patent is subject to a terminal disclaimer.

(21) Appl. No.: 11/231,386

(22) Filed: Sep. 21, 2005

(65) Prior Publication Data

US 2006/0019494 A1    Jan. 26, 2006

Related U.S. Application Data

(63) Continuation of application No. 10/379,438, filed on Mar. 4, 2003, now Pat. No. 6,972,267.

(60) Provisional application No. 60/362,189, filed on Mar. 4, 2002.

(51) Int. Cl.
*H01L 21/4763* (2006.01)
*H01L 21/31* (2006.01)
*H01L 21/469* (2006.01)

(52) U.S. Cl. ............... 438/643; 438/627; 438/785; 257/E21.168; 257/E21.17

(58) Field of Classification Search ........... 438/643, 438/627, 785; 257/E21.168, E21.17
See application file for complete search history.

(56) References Cited

U.S. PATENT DOCUMENTS 3,594,216 A    7/1971 Charles et al.

(Continued)

FOREIGN PATENT DOCUMENTS

EP    0 497 267    8/1992

(Continued)

OTHER PUBLICATIONS

Park, J. S.; Park, H. S.; Kang, S. W. "Plasma-Enhanced Atomic Layer Deposition of Ta-N Thin Films" J. Electrochemical Society, vol. 149(2002), pp. C28-32.*

(Continued)

*Primary Examiner*—Carl Whitehead, Jr.
*Assistant Examiner*—Daniel Luke
(74) *Attorney, Agent, or Firm*—Patterson & Sheridan, LLP

(57) ABSTRACT

Embodiments of the invention provide a method for forming tantalum nitride materials on a substrate by employing an atomic layer deposition (ALD) process. The method includes heating a tantalum precursor within an ampoule to a predetermined temperature to form a tantalum precursor gas and sequentially exposing a substrate to the tantalum precursor gas and a nitrogen precursor to form a tantalum nitride material. Thereafter, a nucleation layer and a bulk layer may be deposited on the substrate. In one example, a radical nitrogen compound may be formed from the nitrogen precursor during a plasma-enhanced ALD process. A nitrogen precursor may include nitrogen or ammonia. In another example, a metal-organic tantalum precursor may be used during the deposition process.

38 Claims, 8 Drawing Sheets

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,415,275 A | 11/1983 | Dietrich | |
| 4,761,269 A | 8/1988 | Conger et al. | |
| 4,825,809 A | 5/1989 | Mieno | |
| 4,834,831 A | 5/1989 | Nishizawa et al. | |
| 4,947,790 A | 8/1990 | Gartner et al. | |
| 4,975,252 A | 12/1990 | Nishizawa et al. | |
| 4,993,357 A | 2/1991 | Scholz | |
| 5,027,746 A | 7/1991 | Frijlink et al. | |
| 5,173,327 A | 12/1992 | Sandhu et al. | |
| 5,178,681 A | 1/1993 | Moore et al. | |
| 5,196,365 A | 3/1993 | Gotou | |
| 5,224,202 A | 6/1993 | Arnold et al. | |
| 5,225,366 A | 7/1993 | Yoder | |
| 5,261,959 A | 11/1993 | Gasworth | |
| 5,281,274 A | 1/1994 | Yoder | |
| 5,294,286 A | 3/1994 | Nishizawa et al. | |
| 5,338,362 A | 8/1994 | Imahashi | |
| 5,374,570 A | 12/1994 | Nasu et al. | |
| 5,441,703 A | 8/1995 | Jurgensen | |
| 5,443,647 A | 8/1995 | Aucoin et al. | |
| 5,464,666 A | 11/1995 | Fine et al. | |
| 5,480,818 A | 1/1996 | Matsumoto et al. | |
| 5,483,919 A | 1/1996 | Yokoyama et al. | |
| 5,503,875 A | 4/1996 | Imai et al. | |
| 5,558,717 A | 9/1996 | Zhao et al. | |
| 5,580,421 A | 12/1996 | Hiatt et al. | |
| 5,668,054 A | 9/1997 | Sun et al. | |
| 5,674,786 A | 10/1997 | Turner et al. | |
| 5,711,811 A | 1/1998 | Suntola et al. | |
| 5,730,802 A | 3/1998 | Ishizumi et al. | |
| 5,796,116 A | 8/1998 | Nakata et al. | |
| 5,807,792 A | 9/1998 | Ilg et al. | |
| 5,834,372 A | 11/1998 | Lee | |
| 5,835,677 A | 11/1998 | Li et al. | |
| 5,846,332 A | 12/1998 | Zhao et al. | |
| 5,855,680 A | 1/1999 | Soininen et al. | |
| 5,879,459 A | 3/1999 | Gadgil et al. | |
| 5,882,411 A | 3/1999 | Zhao et al. | |
| 5,906,683 A | 5/1999 | Chen et al. | |
| 5,916,365 A | 6/1999 | Sherman | |
| 5,923,056 A | 7/1999 | Lee et al. | |
| 5,972,430 A | 10/1999 | DiMeo, Jr. et al. | |
| 5,989,345 A | 11/1999 | Hatano | |
| 6,015,590 A | 1/2000 | Suntola et al. | |
| 6,015,917 A | 1/2000 | Bhandari et al. | |
| 6,042,652 A | 3/2000 | Hyun et al. | |
| 6,071,572 A | 6/2000 | Mosely et al. | |
| 6,079,356 A | 6/2000 | Umotoy et al. | |
| 6,084,302 A | 7/2000 | Sandhu | |
| 6,099,904 A | 8/2000 | Mak et al. | |
| 6,124,158 A | 9/2000 | Dautartas et al. | |
| 6,139,700 A | 10/2000 | Kang et al. | |
| 6,143,082 A | 11/2000 | McInerney et al. | |
| 6,144,060 A | 11/2000 | Park et al. | |
| 6,156,382 A | 12/2000 | Rajagopalan et al. | |
| 6,162,715 A | 12/2000 | Mak et al. | |
| 6,174,377 B1 | 1/2001 | Doering et al. | |
| 6,174,809 B1 | 1/2001 | Kang et al. | |
| 6,183,563 B1 | 2/2001 | Choi et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,207,487 B1 | 3/2001 | Kim et al. | |
| 6,231,672 B1 | 5/2001 | Choi et al. | |
| 6,251,190 B1 | 6/2001 | Mak et al. | |
| 6,268,288 B1 | 7/2001 | Hautala et al. | |
| 6,270,572 B1 | 8/2001 | Kim et al. | |
| 6,270,839 B1 | 8/2001 | Onoe et al. | |
| 6,284,646 B1 | 9/2001 | Leem | |
| 6,287,965 B1 | 9/2001 | Kang et al. | |
| 6,296,711 B1 | 10/2001 | Loan et al. | |
| 6,302,965 B1 | 10/2001 | Umotoy et al. | |
| 6,305,314 B1 | 10/2001 | Sneh et al. | |
| 6,306,216 B1 | 10/2001 | Kim et al. | |
| 6,309,713 B1 | 10/2001 | Mak et al. | |
| 6,342,277 B1 | 1/2002 | Sherman | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,379,748 B1 | 4/2002 | Bhandari et al. | |
| 6,391,785 B1 | 5/2002 | Satta et al. | |
| 6,399,491 B2 | 6/2002 | Jeon et al. | |
| 6,413,381 B1 | 7/2002 | Lee et al. | |
| 6,416,577 B1 | 7/2002 | Suntoloa et al. | |
| 6,416,822 B1 * | 7/2002 | Chiang et al. | 427/561 |
| 6,428,859 B1 | 8/2002 | Chiang et al. | |
| 6,433,314 B1 | 8/2002 | Mandrekar et al. | |
| 6,447,607 B2 | 9/2002 | Soininen et al. | |
| 6,451,119 B2 | 9/2002 | Sneh et al. | |
| 6,451,695 B2 | 9/2002 | Sneh | |
| 6,452,338 B1 | 9/2002 | Horsky | |
| 6,454,860 B2 | 9/2002 | Metzner et al. | |
| 6,464,779 B1 | 10/2002 | Powell et al. | |
| 6,468,924 B2 | 10/2002 | Lee et al. | |
| 6,475,276 B1 | 11/2002 | Elers et al. | |
| 6,475,910 B1 | 11/2002 | Sneh | |
| 6,478,872 B1 | 11/2002 | Chae et al. | |
| 6,481,945 B1 | 11/2002 | Hasper et al. | |
| 6,482,262 B1 | 11/2002 | Elers et al. | |
| 6,482,733 B2 | 11/2002 | Raaijmakers | |
| 6,482,740 B2 | 11/2002 | Soininen et al. | |
| 6,498,091 B1 | 12/2002 | Chen et al. | |
| 6,511,539 B1 | 1/2003 | Raaijmakers | |
| 6,520,218 B1 | 2/2003 | Gregg et al. | |
| 6,524,952 B1 | 2/2003 | Srinivas et al. | |
| 6,534,395 B2 | 3/2003 | Werkhoven et al. | |
| 6,548,112 B1 | 4/2003 | Hillman et al. | |
| 6,551,406 B2 | 4/2003 | Kilpi | |
| 6,551,929 B1 | 4/2003 | Kori et al. | |
| 6,558,509 B2 | 5/2003 | Kraus et al. | |
| 6,561,498 B2 | 5/2003 | Tompkins et al. | |
| 6,569,501 B2 | 5/2003 | Chiang et al. | |
| 6,572,705 B1 | 6/2003 | Suntola et al. | |
| 6,578,287 B2 | 6/2003 | Aswad | |
| 6,579,372 B2 | 6/2003 | Park | |
| 6,585,823 B1 | 7/2003 | Van Wijck | |
| 6,593,484 B2 | 7/2003 | Yasuhara et al. | |
| 6,596,602 B2 | 7/2003 | Iizuka et al. | |
| 6,599,572 B2 | 7/2003 | Saanila et al. | |
| 6,607,976 B2 | 8/2003 | Chen et al. | |
| 6,620,723 B1 | 9/2003 | Byun et al. | |
| 6,620,956 B2 | 9/2003 | Chen et al. | |
| 6,630,030 B1 | 10/2003 | Suntola et al. | |
| 6,630,201 B2 | 10/2003 | Chiang et al. | |
| 6,632,279 B1 | 10/2003 | Ritala et al. | |
| 6,660,126 B2 | 12/2003 | Nguyen et al. | |
| 6,660,622 B2 | 12/2003 | Chen et al. | |
| 6,686,271 B2 | 2/2004 | Raaijmakers et al. | |
| 6,716,287 B1 | 4/2004 | Santiago et al. | |
| 6,718,126 B2 | 4/2004 | Lei | |
| 6,720,027 B2 | 4/2004 | Yang et al. | |
| 6,734,020 B2 | 5/2004 | Lu et al. | |
| 6,740,585 B2 | 5/2004 | Yoon et al. | |
| 6,772,072 B2 | 8/2004 | Ganguli et al. | |
| 6,773,507 B2 | 8/2004 | Jallepally et al. | |
| 6,777,352 B2 | 8/2004 | Tepman et al. | |
| 6,778,762 B1 | 8/2004 | Shareef et al. | |
| 6,784,096 B2 | 8/2004 | Chen et al. | |
| 6,790,773 B1 | 9/2004 | Drewery et al. | |
| 6,797,108 B2 | 9/2004 | Wendling | |

| | | | | | | |
|---|---|---|---|---|---|---|
| 6,800,173 B2 | 10/2004 | Chiang et al. | | 2001/0054769 A1 | 12/2001 | Raaijmakers et al. |
| 6,803,272 B1 | 10/2004 | Halliyal et al. | | 2002/0000196 A1 | 1/2002 | Park |
| 6,811,814 B2 | 11/2004 | Chen et al. | | 2002/0000598 A1 | 1/2002 | Kang et al. |
| 6,815,285 B2 | 11/2004 | Choi et al. | | 2002/0005168 A1 | 1/2002 | Kraus et al. |
| 6,818,094 B2 | 11/2004 | Yudovsky | | 2002/0007790 A1 | 1/2002 | Park |
| 6,821,563 B2 | 11/2004 | Yudovsky | | 2002/0009544 A1 | 1/2002 | McFeely et al. |
| 6,821,891 B2 | 11/2004 | Chen et al. | | 2002/0009896 A1 | 1/2002 | Sandhu et al. |
| 6,827,815 B2 | 12/2004 | Hytros et al. | | 2002/0017242 A1 | 2/2002 | Hamaguchi et al. |
| 6,831,004 B2 | 12/2004 | Byun et al. | | 2002/0020869 A1 | 2/2002 | Park et al. |
| 6,838,125 B2 | 1/2005 | Chung et al. | | 2002/0021544 A1 | 2/2002 | Cho et al. |
| 6,841,200 B2 | 1/2005 | Kraus et al. | | 2002/0031618 A1 | 3/2002 | Sherman |
| 6,846,516 B2 | 1/2005 | Yang et al. | | 2002/0041931 A1 | 4/2002 | Suntola et al. |
| 6,866,746 B2 | 3/2005 | Lei et al. | | 2002/0048635 A1 | 4/2002 | Kim et al. |
| 6,868,859 B2 | 3/2005 | Yudovsky | | 2002/0052097 A1 | 5/2002 | Park |
| 6,875,271 B2 | 4/2005 | Glenn et al. | | 2002/0060363 A1 | 5/2002 | Xi et al. |
| 6,878,206 B2 | 4/2005 | Tzu et al. | | 2002/0066411 A1 * | 6/2002 | Chiang et al. ............... 118/724 |
| 6,881,437 B2 | 4/2005 | Ivanov et al. | | 2002/0068458 A1 | 6/2002 | Chiang et al. |
| 6,893,915 B2 | 5/2005 | Park et al. | | 2002/0073924 A1 | 6/2002 | Chiang et al. |
| 6,902,624 B2 | 6/2005 | Seidel et al. | | 2002/0076481 A1 | 6/2002 | Chiang et al. |
| 6,905,541 B2 | 6/2005 | Chen et al. | | 2002/0076507 A1 | 6/2002 | Chiang et al. |
| 6,905,737 B2 | 6/2005 | Verplancken et al. | | 2002/0076508 A1 | 6/2002 | Chiang et al. |
| 6,911,093 B2 | 6/2005 | Stacey et al. | | 2002/0076837 A1 | 6/2002 | Hujanen et al. |
| 6,915,592 B2 | 7/2005 | Guenther | | 2002/0086106 A1 | 7/2002 | Park et al. |
| 6,916,398 B2 | 7/2005 | Chen et al. | | 2002/0086111 A1 | 7/2002 | Byun et al. |
| 6,921,062 B2 | 7/2005 | Gregg et al. | | 2002/0086507 A1 | 7/2002 | Park et al. |
| 6,932,871 B2 | 8/2005 | Chang et al. | | 2002/0092471 A1 | 7/2002 | Kang et al. |
| 6,936,906 B2 | 8/2005 | Chung et al. | | 2002/0092584 A1 | 7/2002 | Soininen et al. |
| 6,939,801 B2 | 9/2005 | Chung et al. | | 2002/0094689 A1 | 7/2002 | Park |
| 6,946,033 B2 | 9/2005 | Tsuei et al. | | 2002/0098627 A1 | 7/2002 | Pomarede et al. |
| 6,951,804 B2 | 10/2005 | Seutter et al. | | 2002/0098685 A1 | 7/2002 | Sophie et al. |
| 6,953,742 B2 | 10/2005 | Chen et al. | | 2002/0104481 A1 | 8/2002 | Chiang et al. |
| 6,955,211 B2 | 10/2005 | Ku et al. | | 2002/0106536 A1 | 8/2002 | Lee et al. |
| 6,972,267 B2 * | 12/2005 | Cao et al. ................... 438/785 | | 2002/0106846 A1 * | 8/2002 | Seutter et al. ............... 438/200 |
| 6,974,771 B2 | 12/2005 | Chen et al. | | 2002/0108570 A1 | 8/2002 | Lindfors et al. |
| 6,983,892 B2 | 1/2006 | Noorbakhsh et al. | | 2002/0110991 A1 | 8/2002 | Li |
| 6,994,319 B2 | 2/2006 | Yudovsky | | 2002/0115886 A1 | 8/2002 | Yasuhara et al. |
| 6,998,014 B2 | 2/2006 | Chen et al. | | 2002/0117399 A1 | 8/2002 | Chen et al. |
| 7,026,238 B2 | 4/2006 | Xi et al. | | 2002/0121241 A1 | 9/2002 | Nguyen et al. |
| 7,041,335 B2 | 5/2006 | Chung | | 2002/0121342 A1 | 9/2002 | Lu et al. |
| 7,049,226 B2 | 5/2006 | Chung et al. | | 2002/0122884 A1 | 9/2002 | Chen et al. |
| 7,066,194 B2 | 6/2006 | Ku et al. | | 2002/0127336 A1 | 9/2002 | Chen et al. |
| 7,067,422 B2 | 6/2006 | Nakamura et al. | | 2002/0127745 A1 | 9/2002 | Lu et al. |
| 7,081,271 B2 | 7/2006 | Chung et al. | | 2002/0134307 A1 | 9/2002 | Choi |
| 7,081,409 B2 | 7/2006 | Kang et al. | | 2002/0144655 A1 | 10/2002 | Chiang et al. |
| 7,085,616 B2 | 8/2006 | Chin et al. | | 2002/0144657 A1 | 10/2002 | Chiang et al. |
| 7,094,680 B2 | 8/2006 | Seutter et al. | | 2002/0145210 A1 | 10/2002 | Tompkins et al. |
| 7,098,131 B2 | 8/2006 | Kang et al. | | 2002/0146511 A1 | 10/2002 | Chiang et al. |
| 7,175,713 B2 | 2/2007 | Thakur et al. | | 2002/0155722 A1 | 10/2002 | Satta et al. |
| 7,186,385 B2 | 3/2007 | Ganguli et al. | | 2002/0162506 A1 | 11/2002 | Sneh et al. |
| 7,201,803 B2 | 4/2007 | Lu et al. | | 2002/0164421 A1 | 11/2002 | Chiang et al. |
| 7,204,886 B2 | 4/2007 | Chen et al. | | 2002/0164423 A1 | 11/2002 | Chiang et al. |
| 7,208,413 B2 | 4/2007 | Byun et al. | | 2002/0177282 A1 | 11/2002 | Song |
| 7,211,508 B2 | 5/2007 | Chung et al. | | 2002/0182320 A1 | 12/2002 | Leskela et al. |
| 7,222,636 B2 | 5/2007 | Nguyen et al. | | 2002/0187256 A1 | 12/2002 | Elers et al. |
| 7,228,873 B2 | 6/2007 | Ku et al. | | 2002/0187631 A1 * | 12/2002 | Kim et al. ................... 438/637 |
| 7,270,709 B2 | 9/2007 | Chen et al. | | 2002/0197402 A1 | 12/2002 | Chiang et al. |
| 7,294,208 B2 | 11/2007 | Guenther | | 2003/0004723 A1 | 1/2003 | Chihara |
| 2001/0000866 A1 | 5/2001 | Sneh et al. | | 2003/0010451 A1 | 1/2003 | Tzu et al. |
| 2001/0002280 A1 | 5/2001 | Sneh | | 2003/0013320 A1 | 1/2003 | Kim et al. |
| 2001/0009140 A1 | 7/2001 | Bondestam et al. | | 2003/0017697 A1 | 1/2003 | Choi et al. |
| 2001/0009695 A1 | 7/2001 | Saanila et al. | | 2003/0022338 A1 | 1/2003 | Ruben et al. |
| 2001/0011526 A1 | 8/2001 | Doering et al. | | 2003/0022487 A1 | 1/2003 | Yoon et al. |
| 2001/0013312 A1 | 8/2001 | Soininen et al. | | 2003/0029715 A1 | 2/2003 | Yu et al. |
| 2001/0014371 A1 | 8/2001 | Kilpi | | 2003/0031807 A1 | 2/2003 | Elers et al. |
| 2001/0024387 A1 | 9/2001 | Raaijmakers et al. | | 2003/0032281 A1 | 2/2003 | Werkhoven et al. |
| 2001/0025979 A1 | 10/2001 | Kim et al. | | 2003/0038369 A1 | 2/2003 | Layadi et al. |
| 2001/0028924 A1 | 10/2001 | Sherman | | 2003/0042630 A1 | 3/2003 | Babcoke et al. |
| 2001/0034123 A1 | 10/2001 | Jeon et al. | | 2003/0049931 A1 | 3/2003 | Byun et al. |
| 2001/0041250 A1 | 11/2001 | Werkhoven et al. | | 2003/0049942 A1 | 3/2003 | Haukka et al. |
| 2001/0042523 A1 | 11/2001 | Kesala | | 2003/0053799 A1 | 3/2003 | Lei |
| 2001/0042799 A1 | 11/2001 | Kim et al. | | 2003/0054631 A1 | 3/2003 | Raaijmakers et al. |
| 2001/0054377 A1 | 12/2001 | Lindfors et al. | | 2003/0057526 A1 | 3/2003 | Chung et al. |
| 2001/0054730 A1 | 12/2001 | Kim et al. | | 2003/0057527 A1 | 3/2003 | Chung et al. |

| | | |
|---|---|---|
| 2003/0059538 A1 | 3/2003 | Chung et al. |
| 2003/0072913 A1 | 4/2003 | Chou et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0082301 A1 | 5/2003 | Chen et al. |
| 2003/0082307 A1 | 5/2003 | Chung et al. |
| 2003/0087520 A1 | 5/2003 | Chen et al. |
| 2003/0089308 A1 | 5/2003 | Raaijmakers |
| 2003/0096468 A1 | 5/2003 | Soininen et al. |
| 2003/0097013 A1 | 5/2003 | Chen et al. |
| 2003/0101927 A1 | 6/2003 | Raaijmakers |
| 2003/0101938 A1 | 6/2003 | Ronsse et al. |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0124262 A1 | 7/2003 | Chen et al. |
| 2003/0129308 A1 | 7/2003 | Chen et al. |
| 2003/0129826 A1 | 7/2003 | Werkhoven et al. |
| 2003/0134508 A1 | 7/2003 | Raaijmakers et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0143839 A1 | 7/2003 | Raaijmakers et al. |
| 2003/0153177 A1 | 8/2003 | Tepman et al. |
| 2003/0167612 A1 | 9/2003 | Kraus et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190804 A1 | 10/2003 | Glenn et al. |
| 2003/0194493 A1 | 10/2003 | Chang et al. |
| 2003/0198740 A1 | 10/2003 | Wendling |
| 2003/0198754 A1 | 10/2003 | Xi et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2003/0235961 A1 | 12/2003 | Metzner et al. |
| 2004/0005749 A1 | 1/2004 | Choi et al. |
| 2004/0009307 A1 | 1/2004 | Koh et al. |
| 2004/0009665 A1 | 1/2004 | Chen et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0016866 A1 | 1/2004 | Huang et al. |
| 2004/0018304 A1 | 1/2004 | Chung et al. |
| 2004/0018747 A1 | 1/2004 | Byun et al. |
| 2004/0025370 A1 | 2/2004 | Guenther et al. |
| 2004/0033698 A1 | 2/2004 | Lee et al. |
| 2004/0046197 A1 | 3/2004 | Basceri et al. |
| 2004/0048461 A1 | 3/2004 | Chen et al. |
| 2004/0065255 A1 | 4/2004 | Yang et al. |
| 2004/0067641 A1 | 4/2004 | Yudovsky |
| 2004/0069227 A1 | 4/2004 | Ku et al. |
| 2004/0071897 A1 | 4/2004 | Verplancken et al. |
| 2004/0077183 A1 | 4/2004 | Chung |
| 2004/0078723 A1 | 4/2004 | Gross et al. |
| 2004/0105934 A1 | 6/2004 | Chang et al. |
| 2004/0143370 A1 | 7/2004 | Lu et al. |
| 2004/0144308 A1 | 7/2004 | Yudovsky |
| 2004/0144309 A1 | 7/2004 | Yudovsky |
| 2004/0144311 A1 | 7/2004 | Chen et al. |
| 2004/0170403 A1 | 9/2004 | Lei |
| 2004/0187304 A1 | 9/2004 | Chen et al. |
| 2004/0203254 A1 | 10/2004 | Conley et al. |
| 2004/0209460 A1 | 10/2004 | Xi et al. |
| 2004/0211665 A1 | 10/2004 | Yoon et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0253375 A1 | 12/2004 | Ivanov et al. |
| 2004/0256351 A1 | 12/2004 | Chung et al. |
| 2004/0266175 A1 | 12/2004 | Chen et al. |
| 2005/0006799 A1 | 1/2005 | Gregg et al. |
| 2005/0009325 A1 | 1/2005 | Chung et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0074968 A1 | 4/2005 | Chen et al. |
| 2005/0095859 A1 | 5/2005 | Chen et al. |
| 2005/0104142 A1 | 5/2005 | Narayanan et al. |
| 2005/0106865 A1 | 5/2005 | Chung et al. |
| 2005/0115675 A1 | 6/2005 | Tzu et al. |
| 2005/0118804 A1 | 6/2005 | Byun et al. |
| 2005/0139160 A1 | 6/2005 | Lei et al. |
| 2005/0139948 A1 | 6/2005 | Chung et al. |
| 2005/0153571 A1 | 7/2005 | Senzaki |
| 2005/0164487 A1 | 7/2005 | Seutter et al. |
| 2005/0173068 A1 | 8/2005 | Chen et al. |
| 2005/0189072 A1 | 9/2005 | Chen et al. |
| 2005/0220998 A1 | 10/2005 | Chang et al. |
| 2005/0229969 A1 | 10/2005 | Nguyen et al. |
| 2005/0233156 A1 | 10/2005 | Senzaki et al. |
| 2005/0252449 A1 | 11/2005 | Nguyen et al. |
| 2005/0255243 A1 | 11/2005 | Senzaki |
| 2005/0255690 A1 | 11/2005 | Chen et al. |
| 2005/0257735 A1 | 11/2005 | Guenther |
| 2005/0260357 A1 | 11/2005 | Olsen et al. |
| 2005/0266682 A1 | 12/2005 | Chen et al. |
| 2005/0271812 A1 | 12/2005 | Myo et al. |
| 2005/0271813 A1 | 12/2005 | Kher et al. |
| 2005/0271814 A1 | 12/2005 | Chang et al. |
| 2006/0018639 A1 | 1/2006 | Ramamurthy et al. |
| 2006/0019033 A1 | 1/2006 | Muthukrishnan et al. |
| 2006/0019494 A1 | 1/2006 | Cao et al. |
| 2006/0019495 A1 | 1/2006 | Marcadal et al. |
| 2006/0030148 A1 | 2/2006 | Seutter et al. |
| 2006/0035025 A1 | 2/2006 | Verplancken et al. |
| 2006/0057843 A1 | 3/2006 | Chen et al. |
| 2006/0062917 A1 | 3/2006 | Muthukrishnan et al. |
| 2006/0075966 A1 | 4/2006 | Chen et al. |
| 2006/0128150 A1 | 6/2006 | Gandikota et al. |
| 2006/0148253 A1 | 7/2006 | Chung et al. |
| 2006/0153973 A1 | 7/2006 | Chang et al. |
| 2006/0153995 A1 | 7/2006 | Narwankar et al. |
| 2006/0156979 A1 | 7/2006 | Thakur et al. |
| 2006/0199372 A1 | 9/2006 | Chung et al. |
| 2006/0213557 A1 | 9/2006 | Ku et al. |
| 2006/0213558 A1 | 9/2006 | Ku et al. |
| 2006/0216928 A1 | 9/2006 | Chung et al. |
| 2006/0223286 A1 | 10/2006 | Chin et al. |
| 2006/0257295 A1 | 11/2006 | Chen et al. |
| 2006/0276020 A1 | 12/2006 | Yoon et al. |
| 2007/0006398 A1 | 1/2007 | Hercouet |
| 2007/0018244 A1 | 1/2007 | Hung et al. |
| 2007/0020890 A1 | 1/2007 | Thakur et al. |
| 2007/0026147 A1 | 2/2007 | Chen et al. |
| 2007/0044719 A1 | 3/2007 | Ku et al. |
| 2007/0067609 A1 | 3/2007 | Chen et al. |

| | | | |
|---|---|---|---|
| 2007/0079759 | A1 | 4/2007 | Lee et al. |
| 2007/0095285 | A1 | 5/2007 | Thakur et al. |
| 2007/0099415 | A1 | 5/2007 | Chen et al. |
| 2007/0110898 | A1 | 5/2007 | Ganguli et al. |
| 2007/0119370 | A1 | 5/2007 | Ma et al. |
| 2007/0119371 | A1 | 5/2007 | Ma et al. |
| 2007/0128862 | A1 | 6/2007 | Ma et al. |
| 2007/0128863 | A1 | 6/2007 | Ma et al. |
| 2007/0128864 | A1 | 6/2007 | Ma et al. |
| 2007/0235085 | A1 | 10/2007 | Nakashima et al. |
| 2007/0252500 | A1 | 11/2007 | Ranish et al. |

FOREIGN PATENT DOCUMENTS

| | | |
|---|---|---|
| EP | 1 142 894 | 10/2001 |
| EP | 1 167 569 | 1/2002 |
| GB | 2 355 727 | 10/2000 |
| JP | 58-098917 | 6/1983 |
| JP | 04-291916 | 10/1992 |
| JP | 05-047666 | 2/1993 |
| JP | 05-206036 | 8/1993 |
| JP | 05-234899 | 9/1993 |
| JP | 05-270997 | 10/1993 |
| JP | 06-224138 | 8/1994 |
| JP | 07-300649 | 11/1995 |
| JP | 2000-212752 | 8/2000 |
| JP | 2000-319772 | 11/2000 |
| JP | 2001-020075 | 1/2001 |
| JP | 2001-111000 | 4/2001 |
| JP | 2001-172767 | 6/2001 |
| WO | WO 96/17107 | 6/1996 |
| WO | WO 99/01595 | 1/1999 |
| WO | WO 99/29924 | 6/1999 |
| WO | WO 99/65064 | 12/1999 |
| WO | WO 00/16377 | 3/2000 |
| WO | WO 00/54320 | 9/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/66832 | 9/2001 |
| WO | WO 01/88972 | 11/2001 |
| WO | WO 02/01628 | 1/2002 |
| WO | WO 02/08485 | 1/2002 |
| WO | WO 02/08488 | 1/2002 |
| WO | WO 02/43115 | 5/2002 |
| WO | WO 02/45167 | 6/2002 |
| WO | WO 02/45871 | 6/2002 |
| WO | WO 02/46489 | 6/2002 |
| WO | WO 02/067319 | 8/2002 |
| WO | WO 03/023835 | 3/2003 |
| WO | WO 03/044242 | 5/2003 |
| WO | WO 2004/008491 | 1/2004 |
| WO | WO 2004/106584 | 12/2004 |

OTHER PUBLICATIONS

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Goswami, et al. Transition Metals Show Promise as Copper Barriers, Semiconductor International, ATMI, San Jose—May 1, 2004.

Hong, et al. "Characteristics of PAALD-TaN thin films derived from TAIMATA precursor for copper metallization", Interconnect Technology Conference, 2004. Proceedings of the IEEE 2004 International, Jun. 7-9, 2004, pp. 9-11.

Juppo, et al. "Deposition of Copper Films by an Alternate Supply of CuCl and Zn," Journal of Vacuum Science & Technology, vol. 15, No. 4 (Jul. 1997), pp. 2330-2333.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of $HfO_2$-$Ta_2$-$O_5$ Nanolaminates," Applied Physics Letters, vol. 68, No. 26, Jun. 24, 1996; p. 3737-9.

Martensson, et al. "Atomic Layer Epitaxy of Copper Growth and Selectivity in the Cu(II)-2,2,6,6-tetramethyl-3-5heptanedionate $H_2$ Process," J. Electrochem. Soc., vol. 145, No. 8 (Aug. 1998), pp. 2926-2631.

Martensson, et al. "Atomic Layer Epitaxy of Copper on Tantalum," Chem. Vap. Deposition (1997) vol. 3, No. 1.

Martensson, et al. "$Cu_2$ as Copper Source in Atomic Layer Epitaxy," Chemical Vapor Deposition. Proceedings of the Fourteenth International Conference and EUROCVD-11 (1997), pp. 1529-1536.

Martensson, et al. "Use of Atomic Layer Epitaxy for Fabrication of Si/TiN/Cu Structures," Journal of Vacuum Science & Technology, vol. 17, No. 5 (Sep. 1999), pp. 2122-2128.

McGeachin, "Synthesis and Properties of Some β-diketimines Derived from Acetylacetone, and Their Metal Complexes," Canadian Journal of Chemistry, vol. 46, (Jun. 1968) No. 11.

Niinisto, et al. "Synthesis of Oxide Thin Films and Overlayers by Atomic Layer Epitaxy for Advanced Applications," Materials Science and Engineering B41 (1996) 23-29.

Park, et al. "Performance improvement of MOSFET with $HfO_2$-$Al_2O_3$ laminate gate dielectric and CVD-TaN metal gate deposited by TAIMATA", Electron Devices Meeting, 2003. IEDM '03 Technical Digest. IEEE International Dec. 8-10, 2003, pp. 13.6.1-13.6.4.

Ritala, et al. "Chemical Vapor Deposition," Jan. 1999, pp. 6-9.

Rossnagel, et al. "Plasma-enhanced Atomic Layer Deposition of Ta and Ti for Interconnect Diffusion Barriers," J. Vac. Sci. Technol. B., vol. 18, No. 4 (Jul. 2000); p. 2016-20.

Shenai, et al. "Correlation of vapor pressure equation and film properties with trimethylindium purity for the MOVPE grown III-V compounds," Journal of Crystal Growth 248 (2003) pp. 91-98.

Solanki, et al. "Atomic Layer Deposition of Copper Seed Layers," Electrochem. Solid-State Lett., vol. 3, No. 10 (2000), pp. 479-480.

Utriainen, et al. "Studies of Metallic Thin Film Growth in an Atomic Layer Epitaxy Reactor Using $M(acac)_2$(M=Ni,Cu, Pt) Precursors," Applied Surface Science, vol. 157, No. 3 (2000), pp. 151-158.

"$Ta(N_1C_5H_{11})[N(CH_3)_2]$ Taimata® ," http://c1005059.securesites.net/topic/Taimata/Taimata-E.htm, Jun. 13, 2007, pp. 1-3.

* cited by examiner

SEQUENTIAL DEPOSITION OF TANTALUM NITRIDE USING A TANTALUM-CONTAINING PRECURSOR AND A NITROGEN-CONTAINING PRECURSOR

CROSS-REFERENCE TO RELATED APPLICATIONS

This application is a continuation of U.S. Ser. No. 10/379,438, filed on Mar. 4, 2003, now U.S. Pat. No. 6,972,267, which claims benefit of U.S. Ser. No. 60/362,189, filed Mar. 4, 2002, which are both herein incorporated by reference in their entirety

BACKGROUND OF THE INVENTION

1. Field of the Invention

This invention relates to semiconductor processing. More particularly, this invention relates to improvements in the process of depositing refractory metal layers on semiconductor substrates using sequential deposition techniques.

2. Description of the Related Art

The semiconductor industry continues to strive for larger production yields while increasing the uniformity of layers deposited on substrates having increasingly larger surface areas. These same factors in combination with new materials also provide higher integration of circuits per unit area on the substrate. As circuit integration increases, the need for greater uniformity and process control regarding layer characteristics rises. Formation of refractory metal layers in multi-level integrated circuits poses many challenges to process control, particularly with respect to contact formation.

Contacts are formed by depositing conductive interconnect material in an opening on the surface of insulating material disposed between two spaced-apart conductive layers. The aspect ratio of such an opening inhibits deposition of conductive interconnect material that demonstrates satisfactory step coverage and gap-fill, employing traditional interconnect material such as aluminum. In addition, the resistance of aluminum has frustrated attempts to increase the operational frequency of integrated circuits.

Attempts have been made to provide interconnect material with lower electrical resistivity than aluminum. This has led to the substitution of copper for aluminum. Copper suffers from diffusion resulting in the formation of undesirable intermetallic alloys that require the use of barrier materials.

Barrier layers formed from sputtered tantalum (Ta) and reactive sputtered tantalum nitride (TaN) have demonstrated properties suitable for use with copper. Exemplary properties include high conductivity, high thermal stability and resistance to diffusion of foreign atoms. However, sputter deposition of tantalum and/or tantalum nitride films is limited to use for features of relatively large sizes, e.g., >0.3 μm and contacts in vias having small aspect ratios.

A CVD process offers an inherent advantage over a PVD process of better conformability, even in small structures 0.25 μm with high aspect ratios. As a result, CVD deposition of tantalum and tantalum nitride with various metal-organic sources has been employed. Examples of metal-organic sources include tertbutylimidotris(diethylamido) tantalum (TBTDET), pentakis(dimethylamido) tantalum (PDMAT) and pentakis(diethylamido) tantalum (PDEAT).

Attempts have been made to use existing CVD-based tantalum deposition techniques in an atomic layer deposition (ALD) mode. Such attempts, however, suffer drawbacks. For example, formation of tantalum films from tantalum pentachloride ($TaCl_5$) may require as many as three treatment cycles using various radial based chemistries to perform reduction process of the tantalum to form tantalum nitride. Processes using $TaCl_5$ may suffer from chlorine contamination within the tantalum nitride layer.

There is a need, therefore, for tantalum chemistries that may be employed with fewer reduction steps and shorter cycle times.

SUMMARY OF THE INVENTION

A method for forming a tantalum-containing layer on a substrate disposed in a processing chamber, comprising heating a TBTDET precursor to a predetermined temperature of at least 65° C. to form a tantalum-containing gas, forming a tantalum-containing layer upon the substrate by adsorption of the tantalum-containing gas onto the substrate, reacting a nitrogen-containing process gas with the tantalum-containing layer to produce a layer of tantalum nitride and repeating forming the tantalum-containing layer and reacting the nitrogen-containing process gas with the tantalum-containing layer to form a layer of tantalum nitride of desired thickness, defining a final tantalum nitride layer. In accordance with another embodiment of the present invention an apparatus is disclosed that carries-out the steps of the method.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
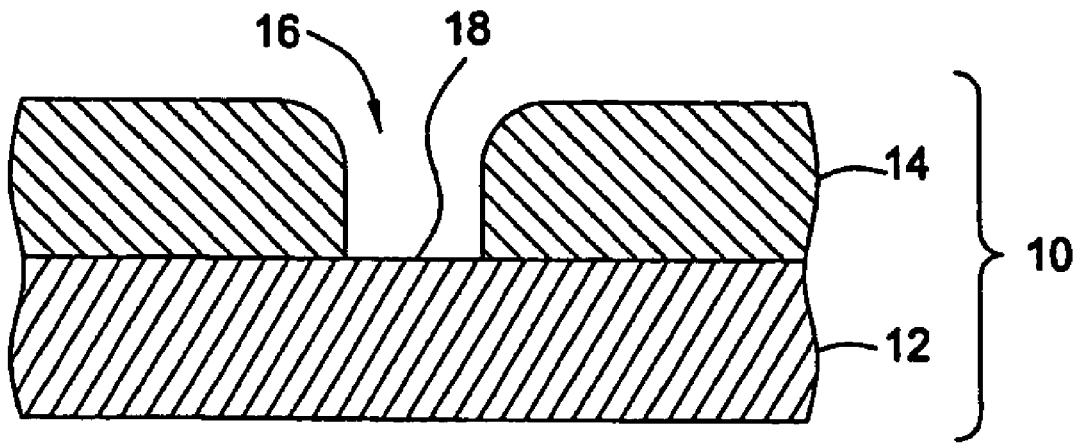
FIG. 1 is a detailed cross-sectional view of a substrate before deposition of a tantalum nitride layer in accordance with one embodiment of the present invention.

Referring to FIG. 1 an exemplary structure upon which a tantalum nitride layer, discussed more fully below, is formed in accordance with the present invention is shown as a substrate 10. Substrate 10 includes a wafer 12 that may have one or more layers, shown as layer 14, disposed thereon. Wafer 12 may be formed from any material suitable for semiconductor processing, such as silicon, and layer 14 may be formed from any suitable material, including dielectric or conductive materials. For purposes of the present example, layer 14 includes a void 16, exposing a region 18 of wafer 12.

Embodiments of the processes described herein deposit tantalum-containing materials or tantalum nitride on many substrates and surfaces. Substrates on which embodiments of the invention may be useful include, but are not limited to semiconductor wafers, such as crystalline silicon (e.g., Si<100> or Si<111>), silicon oxide, silicon germanium, doped or undoped polysilicon, doped or undoped silicon wafers silicon nitride and patterned or non-patterned wafers. Surfaces include bare silicon wafers, films, layers and materials with dielectric, conductive and barrier properties and include aluminum oxide and polysilicon. Pretreatment of surfaces includes polishing, etching, reduction, oxidation, hydroxylation, annealing or baking the substrate. A substrate can be pretreated to be terminated with a variety of functional groups such as hydroxyls (OH), alkoxy (OR, where R=Me, Et, Pr or Bu), haloxyls (OX, where X=F, Cl, Br or I), halides (F, Cl, Br or I), oxygen radicals, aminos (NH or $NH_2$) or amidos (NR or $NR_2$, where R=Me, Et, Pr or Bu).

Figure 2:
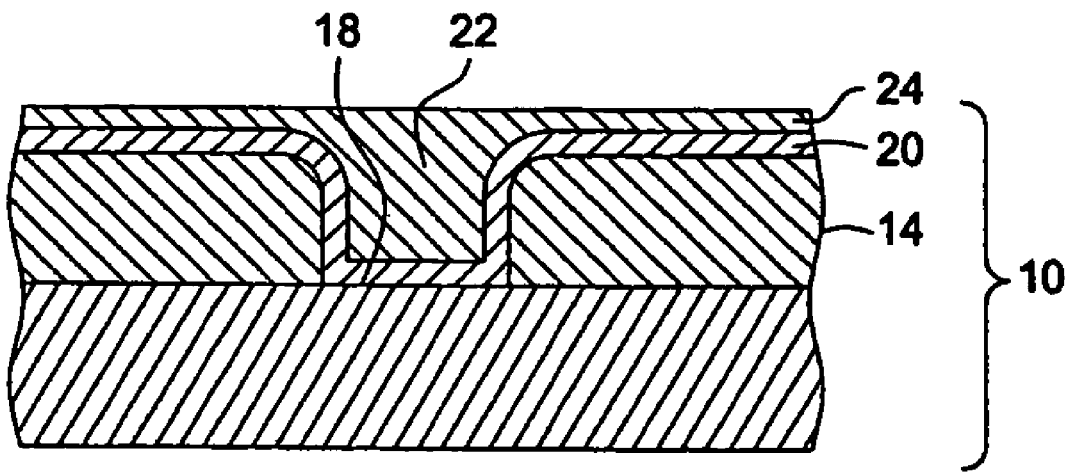
FIG. 2 is a detailed cross-sectional view of a substrate shown above in FIG. 1 after deposition of a tantalum nitride (TaN) layer and a copper contact in accordance with one embodiment of the present invention.

Referring to FIG. 2, formed adjacent to layer 14 and region 18 is a barrier layer 20 containing a refractory metal compound, such as tantalum. In the present example, barrier layer 20 is formed from tantalum nitride, TaN, by sequentially exposing substrate 10 to processing gases to form layers of differing compounds on substrate 10. Although not required, in this present case monolayers of differing compounds may be formed. Tantalum nitride barrier layer 20 conforms to the profile of void 16 so as to cover region 18 and layer 14. A contact 22 is fabricated in accordance with the present invention by formation of a copper layer 24 adjacent to barrier layer 20, filling void 16. Copper layer 24 may be formed using standard techniques (e.g., ALD, PVD, CVD and/or electroplating) and include seed formation and/or fill.

With this configuration, a contact consisting of tantalum nitride barrier layer 20 and copper layer 24 is formed. Tantalum nitride barrier layer 20 serves as a seed layer to promote the formation of copper layer 24 using, for example, electroplating techniques. Important characteristics that barrier layer 20 should demonstrate include good step coverage and thickness uniformity. To that end, tantalum nitride barrier layer 20 is deposited employing sequential techniques, such as atomic layer deposition.

Figure 3:
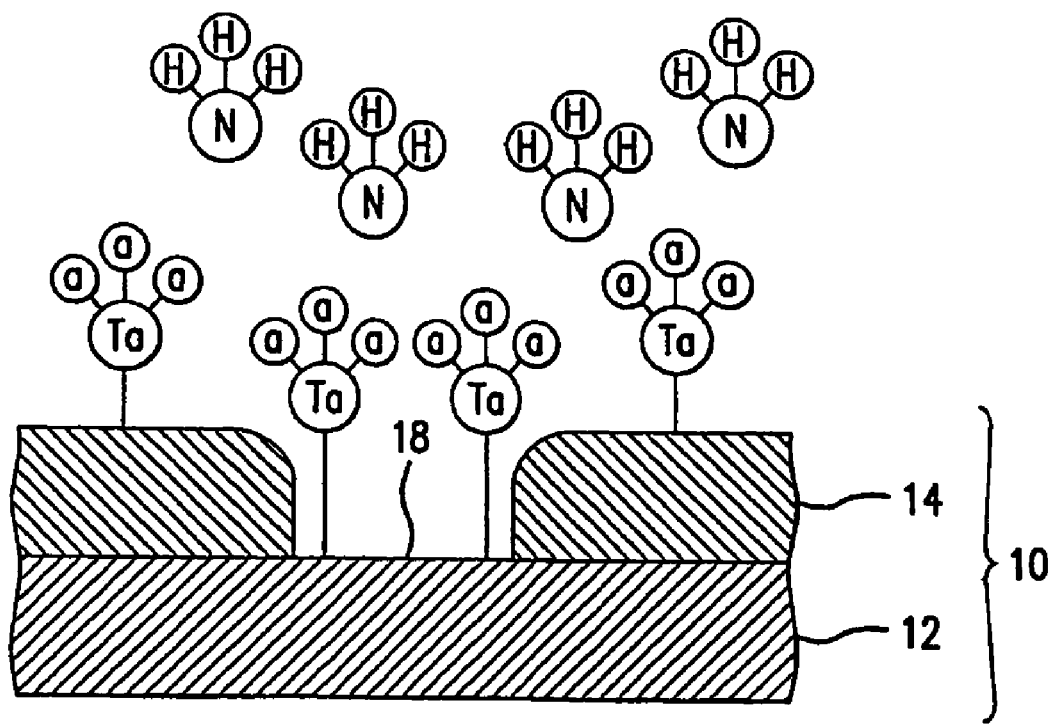
FIG. 3 is a schematic view showing deposition of a first molecule onto a substrate during sequential deposition techniques in accordance with one embodiment of the present invention.
Figure 4:
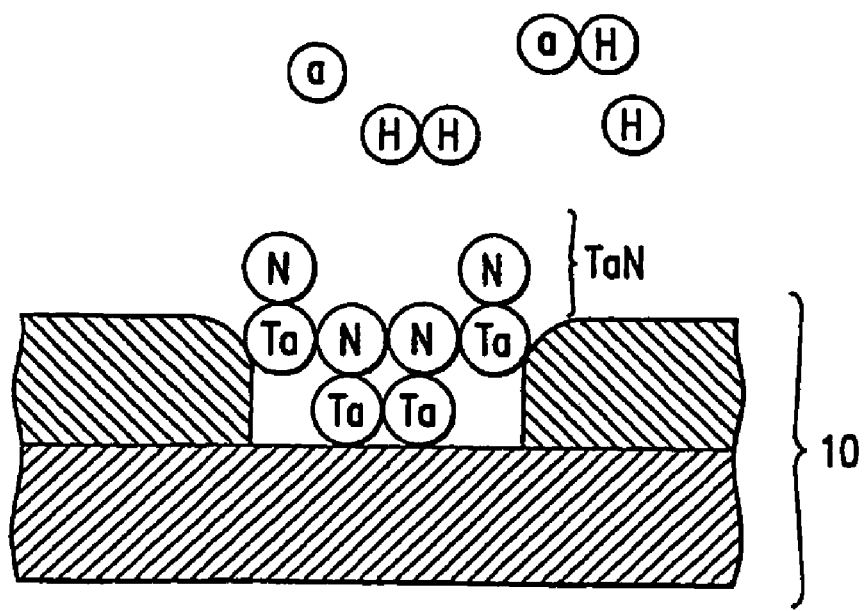
FIG. 4 is a schematic view showing deposition of second molecule onto a substrate during sequential deposition techniques in accordance with one embodiment of the present invention.

Referring to FIGS. 2, 3 and 4, one example of forming barrier layer 20 employing sequential deposition techniques includes exposing substrate 10 to a tantalum-containing gas formed from vaporization of a liquid precursor ($^t$BuN)Ta$(NEt_2)_3$ (TBTDET) to form a tantalum-containing gas that includes TBTDET. It is believed that the initial surface of substrate 10, e.g., the surface of layer 14 and region 18, presents active ligands to the tantalum-containing gas. To that end, substrate 10 is heated within a range from about 250° C. to about 450° C. and placed in a controlled environment that is pressurized within a range from about 1 Torr to about 100 Torr, inclusive. Substrate 10 is exposed to a process gas that includes the tantalum-containing gas and a carrier gas. The carrier gas may be Ar, He, $N_2$, $H_2$ or combinations thereof and may be used as a purge gas. This results in a tantalum-containing layer being deposited on substrate 10. It is believed that the tantalum-containing layer has a surface of ligands comprising amido (—$NEt_2$) and imido (=NtBu), shown generally as "a". The tantalum-containing layer includes bound tantalum complexes with ligands, such that "a"=0-5, often 3 or 4.

The tantalum-containing layer is exposed to another process gas that includes a nitrogen-containing gas and a carrier gas to form the tantalum-containing layer forming a barrier layer 20 of tantalum nitride. In this example, the nitrogen-containing gas is $NH_3$ gas and either Ar or $N_2$ is the carrier gas. It is believed that the amido and imido ligands in the exposed surface of the tantalum-containing layer react with the $NH_3$ process gas to form byproducts that include radicals (e.g., $NH_2$, $NEt_2$, N$^t$Bu, HN$^t$Bu or $^t$Bu), butene, amines (e.g., $HNEt_2$ or $H_2$N$^t$Bu), $(Et_2N)_2$ and $H_2$ among others. In this manner, a surface comprising a layer of tantalum nitride molecules is formed upon substrate 10.

Although not required, the tantalum nitride layer may be a monolayer of tantalum nitride molecules. In some embodiments, the process proceeds cycle after cycle, until tantalum nitride barrier layer 20 has a desired thickness achieved, with each cycle having a duration from about 0.01 seconds to about 60 seconds, preferably from about 0.1 seconds to about 10 seconds, depending upon the processing system employed. The tantalum nitride barrier layer 20 generally has a thickness in the range from about 10 Å to about 1,000 Å.

An important precursor characteristic is to have a favorable vapor pressure. Precursors may be a plasma, gas, liquid or solid at ambient temperature and pressure. However, within the ALD chamber, precursors are volatilized. Organometallic compounds or complexes that may be heated prior to delivery include any chemical containing a metal and at least one organic group, such as alkyls, alkoxyls, alkylamidos and anilides. Precursors comprise of organometallic and halide compounds.

Exemplary tantalum precursors that may be heated to form tantalum-containing gases include tantalum compounds containing ligands such as alkylamidos, alkylimidos, cyclopentadienyls, halides, alkyls, alkoxides or combinations thereof. Alkylamido tantalum compounds used as tantalum precursors include $(RR'N)_5Ta$, where R or R' are independently hydrogen, methyl, ethyl, propyl or butyl. Alkylimido tantalum compounds used as tantalum precursors include $(RN)(R'R''N)_3Ta$, where R, R' or R" are independently hydrogen, methyl, ethyl, propyl or butyl. Specific tantalum precursors include: $(Et_2N)_5Ta$, $(Me_2N)_5Ta$, $(EtMeN)_5Ta$, $(Me_5C_5)TaCl_4$, $(acac)(EtO)_4Ta$, $Br_5Ta$, $Cl_5Ta$, $I_5Ta$, $F_5Ta$, $(NO_3)_5Ta$, $(^tBuO)_5Ta$, $(^iPrO)_5Ta$, $(EtO)_5Ta$ and $(MeO)_5Ta$.

Exemplary nitrogen precursors utilized in nitrogen-containing gases include: $NH_3$, $N_2$, hydrazines (e.g., $N_2H_4$ or $MeN_2H_3$), amines (e.g., $Me_3N$, $Me_2NH$ or $MeNH_2$), anilines (e.g., $C_6H_5NH_2$), organic azides (e.g., $MeN_3$ or $Me_3SiN_3$), inorganic azides (e.g., $NaN_3$ or $Cp_2CoN_3$) and radical nitrogen compounds (e.g., $N_3$, $N_2$, N, NH or $NH_2$). Radical nitrogen compounds can be produced by heat, hot-wires and/or plasma.

Figure 5:
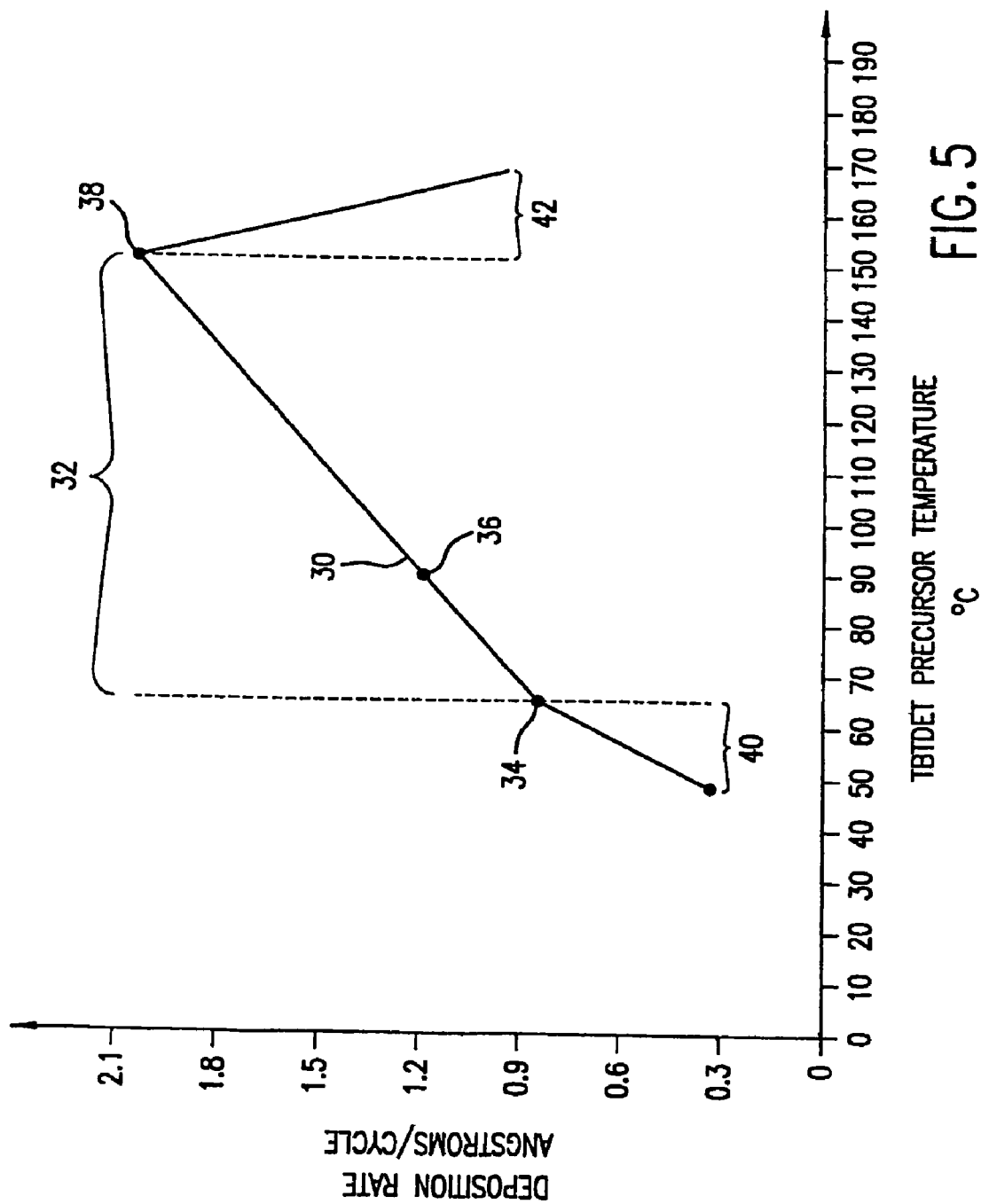
FIG. 5 is a graphic representation showing the growth rate per cycle of a tantalum nitride layer versus a pre-heating temperature of a TBTDET precursor, in accordance with the present invention.

Referring to FIGS. 4 and 5, it was discovered that the time required to form tantalum nitride barrier layer 20 may be reduced by heating the TBTDET precursor before formation of the tantalum-containing layer on substrate 10. As shown by curve 30 it was found that by heating the TBTDET precursor in the range from about 65° C. to about 150° C., shown as segment 32, the growth rate of the layers of tantalum nitride per ALD cycle may be maximized. Specifically, point 34 shows the growth rate at about 65° C. being a little less than about 0.9 Å per cycle. Point 36 shows the growth rate at about 90° C. being a little less than about 1.2 Å per cycle, and point 38 shows the growth rate at about 150° C. being approximately 2.0 Å per cycle. A segment 40 of curve 30 shows that for temperatures below about 65° C., the growth rate of tantalum nitride is substantially reduced. A segment 42 of curve 30 shows that for temperatures above about 150° C., the growth rate of tantalum nitride is substantially reduced. Thus, the slope of a segment 32 of curve 30 shows that the growth rate of tantalum nitride barrier layer 20 is greater for temperatures within a range from about 65° C. to about 150° C. compared to other temperatures for the TBTDET precursor.

Figure 6:
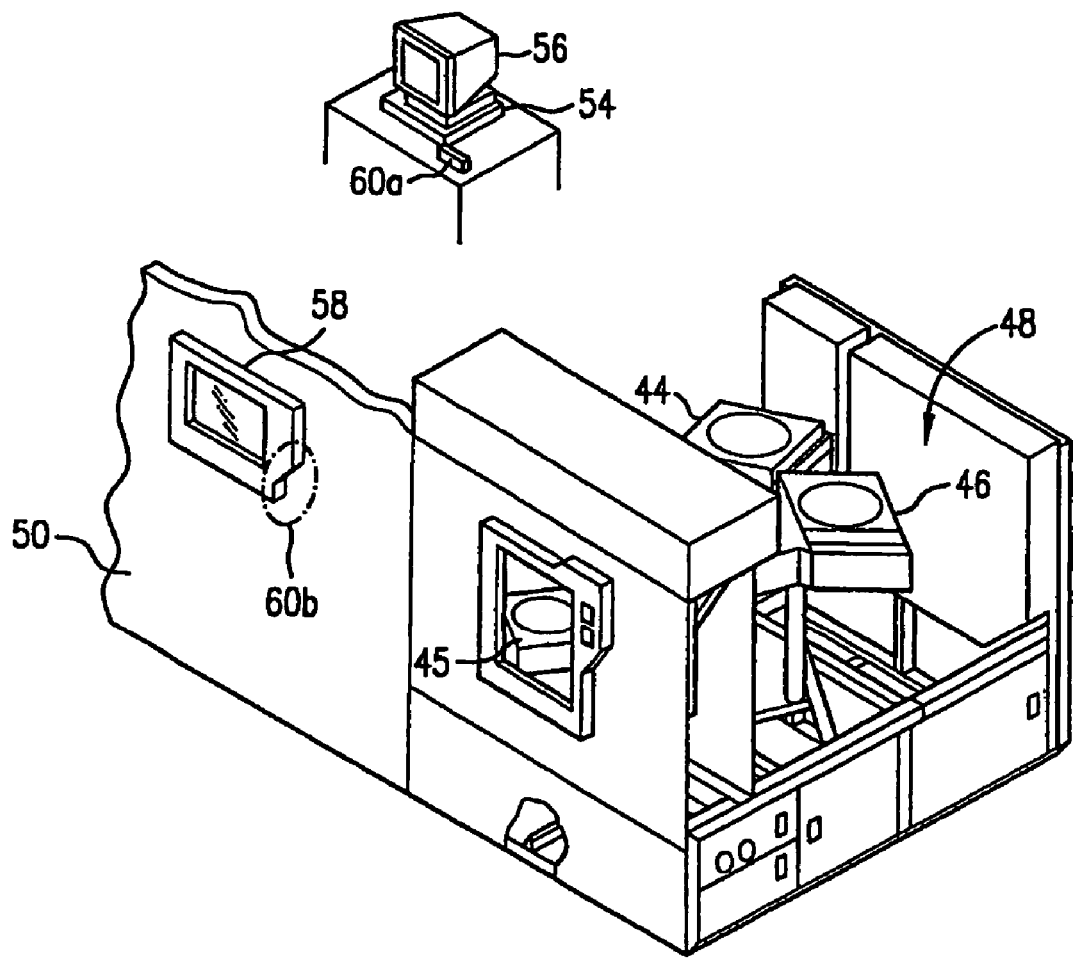
FIG. 6 is a perspective view of a semiconductor processing system in accordance with the present invention.

Referring to FIG. 6, an exemplary wafer processing system employed to deposit a tantalum nitride layer in accordance with the present invention includes one or more processing chambers 44, 45 and 46. Processing chambers 44, 45 and 46 are disposed in a common work area 48 surrounded by a wall 50. Processing chambers 44, 45 and 46 are in data communication with a controller 54 that is connected to one or more monitors, shown as 56 and 58. Monitors 56 and 58 typically display common information concerning the process associated with the processing chambers 44, 45 and 46. Monitor 58 is mounted to the wall 50, with monitor 56 being disposed in the work area 48. Operational control of processing chambers 44, 45 and 46 may be achieved with use of a light pen, associated with one of monitors 56 and 58, to communicate with controller 54. For example, a light pen 60a is associated with monitor 56 and facilitates communication with the controller 54 through monitor 56. A light pen 60b facilitates communication with controller 54 through monitor 58.

Figure 7:
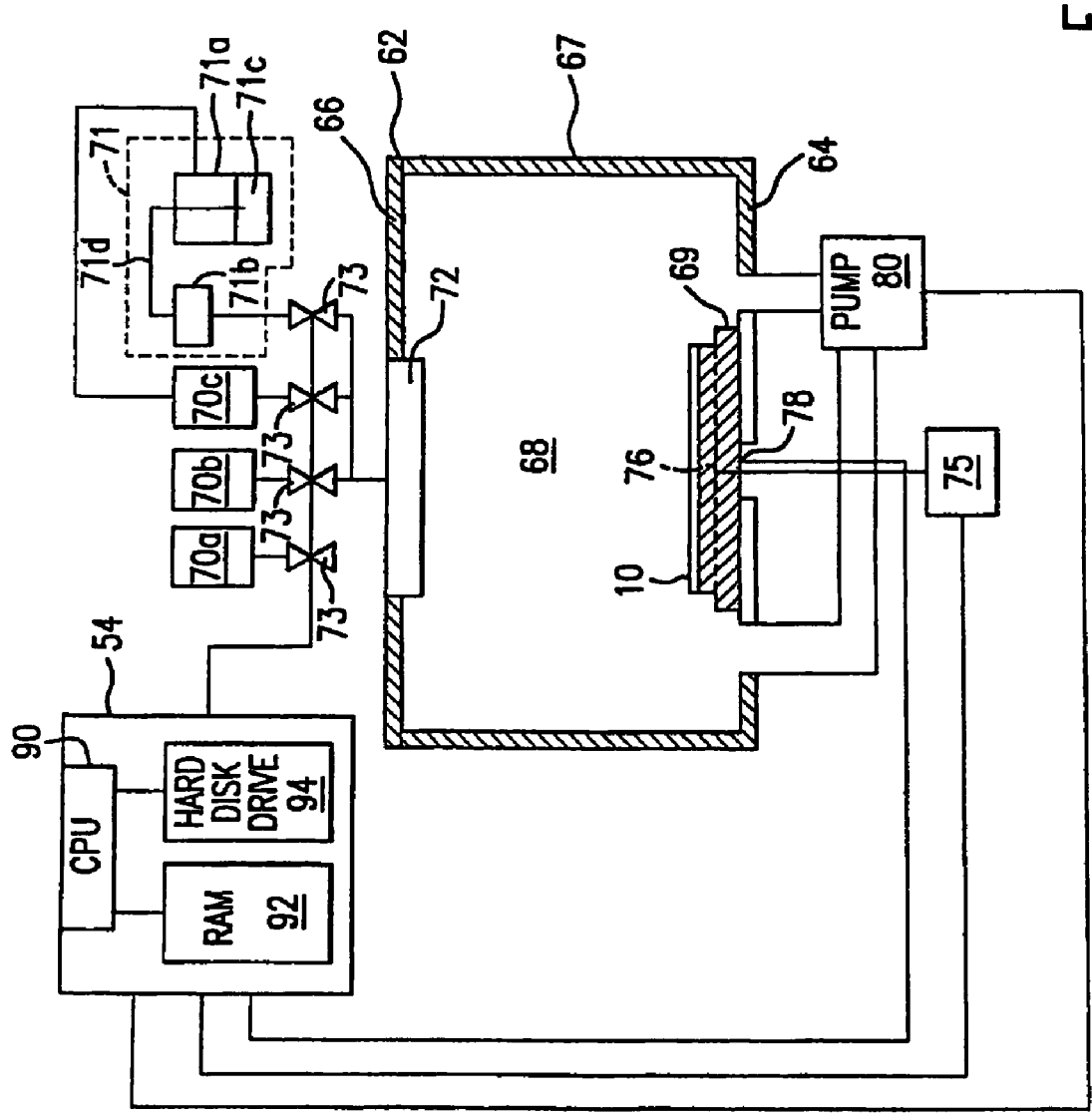
FIG. 7 is a detailed view of the processing chambers shown above in FIG. 6.

Referring to both FIGS. 6 and 7, each of processing chambers 44, 45 and 46 includes a housing 62 having a base wall 64, a cover 66, disposed opposite to base wall 64, and a sidewall 67, extending there between. Housing 62 defines a chamber 68. A pedestal 69 is disposed within processing chamber 68 to support substrate 10. Pedestal 69 may be mounted to move between cover 66 and base wall 64, using a displacement mechanism (not shown), but is typically fixed proximate to base wall 64. Supplies of processing fluids 70a, 70b, 70c and 71 are in fluid communication with processing chamber 68 via a manifold 72. In the present example supply 70a may contain $NH_3$, supply 70b may contain $N_2$ and supply 70c may contain Ar. Process fluid supply 71 includes an ampoule 71a in fluid communication with a vaporizer 71b. Ampoule 71a includes a supply of TBTDET precursor 71c and is in fluid communication with supply 70c. Ampoule 71a is in fluid communication with vaporizer 71b via precursor channel 71d to deliver, to processing chamber 68, precursor 71c, with the aid of carrier gas in supply 70c. Ampoule 71a, liquid 71c and channel 71d may be heated by conventional heating methods, e.g., heating tape in the range from about 65° C. to about 150° C. Regulation of the flow of gases from supplies 70a, 70b, 70c and 71 is effectuated via flow valves 73 that are regulated by computer control, discussed more fully below. Flow valves 73 may be any suitable valve. Actuation rates of flow valves 73 may be in the range of a microsecond to several milliseconds to seconds.

Substrate 10 is heated to processing temperature by a heater embedded within pedestal 69. For example, pedestal 69 may be resistively heated by applying an electric current from an AC power supply 75 to a heater element 76. Substrate 10 is, in turn, heated by pedestal 69, and can be maintained within a desired process temperature range, with the actual temperature varying dependent upon the gases employed and the topography of the surface upon which deposition is to occur. A temperature sensor 78, such as a thermocouple, is also embedded in pedestal 69 to monitor the temperature of pedestal 69 in a conventional manner. For example, the measured temperature may be used in a feedback loop to control the electrical current applied to heater element 76 by power supply 75, such that the wafer temperature can be maintained or controlled at a desired temperature that is suitable for the particular process application. Substrate 10 may be heated using radiant heat, e.g., heat lamps or plasma (not shown). A vacuum pump 80 is used to evacuate processing chamber 68 and to help maintain the proper gas flows and pressure inside processing chamber 68.

Figure 8:
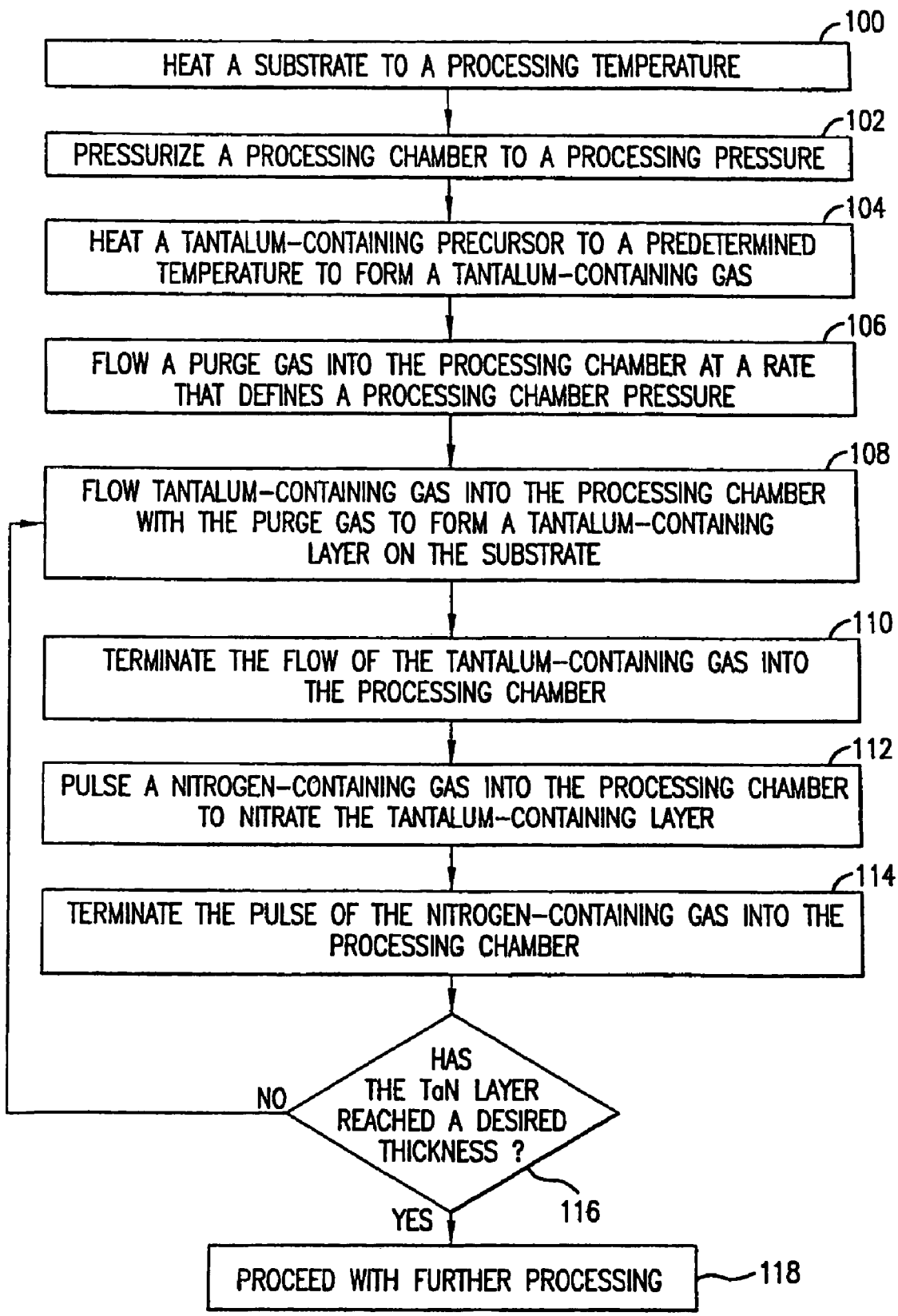
FIG. 8 is flow diagram showing a method of depositing a tantalum nitride layer, in accordance with one embodiment of the present invention.

Referring to FIGS. 7 and 8, a method in accordance with one embodiment of the present invention includes heating substrate 10 to a processing temperature within a range from about 250° C. to about 450° C. at step 100. At step 102 processing chamber 68 is pressurized within a range from about 1 Torr to about 100 Torr. This is achieved by activating vacuum pump 80 to evacuate processing chamber 68. At step 104, the TBTDET precursor is heated in ampoule 71a within a range from about 65° C. to about 150° C. This forms a tantalum-containing gas that includes TBTDET. At step 106 a purge gas, such as argon, Ar, is flowed into processing chamber 68 for a sufficient amount of time to purge processing chamber 68. The actual time during which Ar is flowed into processing chamber 68 is dependent upon the system employed.

In the present example, Ar is flowed into processing chamber 68 in a range of from about 5 to about 10 seconds to purge processing chamber 68. At step 108, the tantalum-containing gas is flowed into processing chamber 68 along with Ar gas to create a tantalum-containing layer on substrate 10 that includes TBTDET. To that end, Ar gas from supply 70c is flowed into ampoule 71a at a rate in the range from about 50 sccm to about 2,000 sccm, preferably about 500 sccm. After a sufficient time, which is dependent upon the process system employed, the flow of tantalum-containing gas is terminated, at step 110. In the present example, the flow of tantalum-containing gas is terminated after about 5 seconds to about 25 seconds after the flow commenced. The flow of Ar gas may terminate with the flow of tantalum-containing gas. Alternatively, the flow of Ar gas may continue for a sufficient amount of time, depending upon the processing system employed, to ensure removal from processing chamber 68 of tantalum-containing gas and reaction byproducts, at step 110.

In the present example the time that the flow of Ar gas continues is in the range from about 5 seconds to about 10 seconds. Subsequently at step 112, a nitrogen-containing gas, such as $NH_3$ gas, is pulsed into processing chamber 68, along with the purge gas for a sufficient amount of time to create a reaction between nitrogen, in the $NH_3$ gas, and the tantalum-containing layer to form a layer of tantalum nitride. The resulting layer of tantalum nitride may be a monolayer of tantalum nitride molecules. To that end, the duration of the pulse of $NH_3$ gas is dependent upon the processing system employed, but in the present example the flow of $NH_3$ gas was in the range from about 5 seconds to about 35 seconds. The pulse of the nitrogen-containing gas into processing chamber 68 is subsequently terminated, at step 114. The flow of the purge gas may be terminated along with the flow of the nitrogen-containing gas. Alternatively, the flow of the purge gas may continue at step 114. In this manner, $NH_3$ gas and byproducts of the reaction of nitrogen with the tantalum-containing layer are removed from processing chamber 68. This completes one cycle of the sequential deposition technique in accordance with the present invention. The aforementioned cycle is repeated multiple times until barrier layer 20 reaches a desired thickness shown in FIG. 2.

It has been found that each cycle results in the formation of a tantalum nitride layer having a thickness within a range from about 0.9 Å to about 1.2 Å. As a result, at step 116, it is determined whether the tantalum nitride layer has reached a desired thickness employing any known means in the art. Were it determined that the tantalum nitride layer had not reached a desired thickness, then the process would proceed to step 108. Were it determined that tantalum nitride layer had reached a desired thickness, then the process would proceed with further processing at step 118. An example of further processing could include formation of a copper layer 24, shown in FIG. 2, employing standard formation techniques, such as electroplating. Further processing includes a seed layer or a nucleation layer deposited via ALD, CVD or PVD techniques.

Referring to both FIGS. 2 and 7, the process for depositing the tantalum and copper layers 20 and 24 may be controlled using a computer program product that is executed by controller 54. To that end, controller 54 includes a central processing unit (CPU) 90, a volatile memory, such as a random access memory (RAM) 92 and permanent storage media, such as a floppy disk drive for use with a floppy diskette, or hard disk drive 94. The computer program code can be written in any conventional computer readable programming language; for example, 68000 assembly language, C, C++, Pascal, Fortran, and the like. Suitable program code is entered into a single file, or multiple files, using a conventional text editor and stored or embodied in a computer-readable medium, such as the hard disk drive 94. If the entered code text is in a high level language, the code is compiled and the resultant compiler code is then linked with an object code of precompiled Windows® library routines. To execute the linked and compiled object code the system user invokes the object code, causing CPU 90 to load the code in RAM 92. CPU 90 then reads and executes the code to perform the tasks identified in the program.

Figure 9:
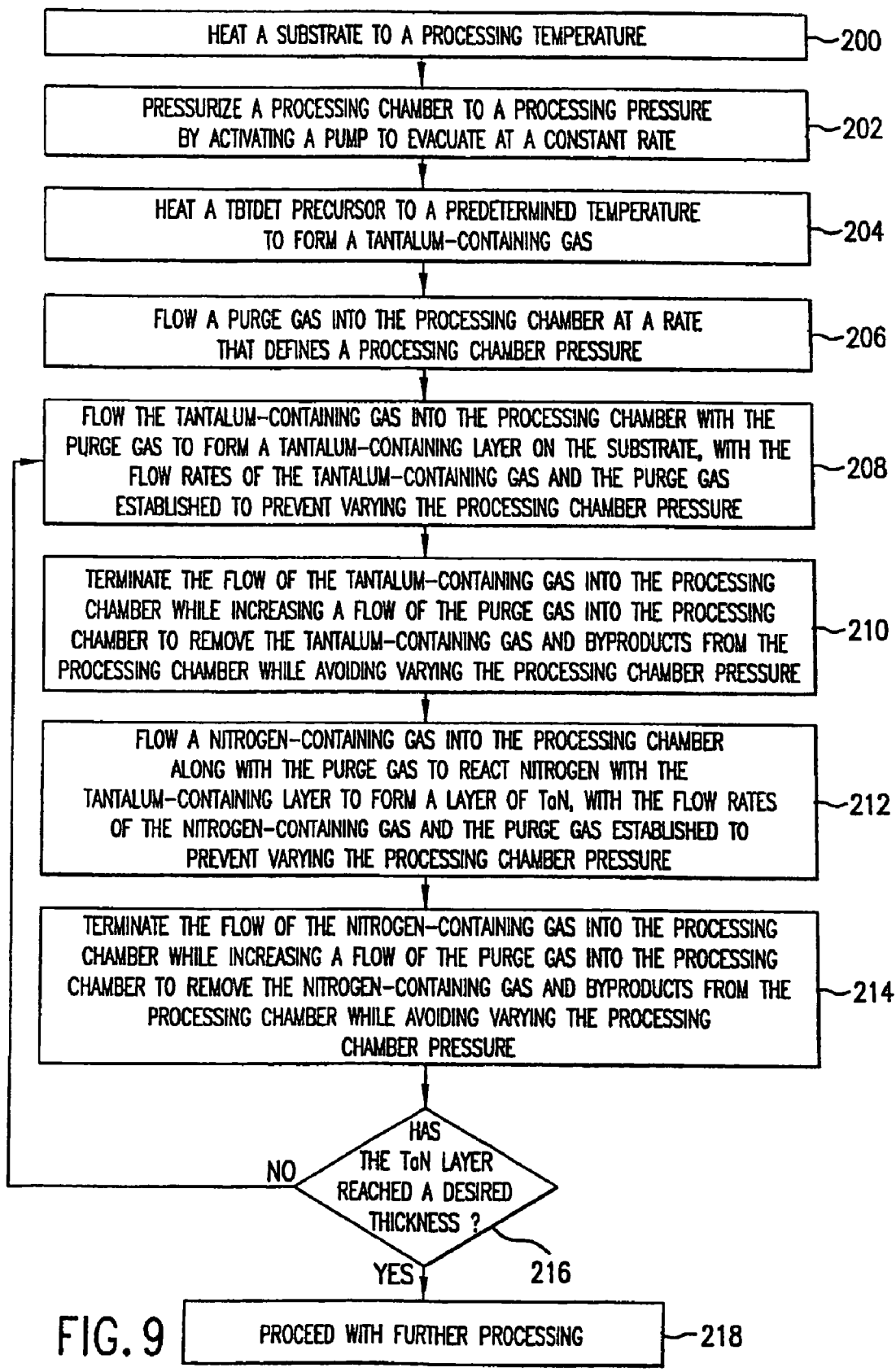
FIG. 9 is flow diagram showing a method of depositing a tantalum nitride layer, in accordance with one embodiment of the present invention.

Referring to FIGS. 7 and 9, a method in accordance with an alternate embodiment overcomes difficulty in having vacuum pump 80 establish the processing pressure during the differing processing steps of the sequential deposition process. Specifically, it was found that relying on vacuum pump 80 to establish the processing pressure might increase the time required to form a tantalum nitride layer. This is due, in part, to the time required for vacuum pump 80 to stabilize (settle) in order to evacuate at a constant rate and thus pump down the processing chamber 68 to establish the processing pressure. To avoid the pump stabilization problem, vacuum pump 80 may be set to evacuate processing chamber 68 at a constant rate throughout the sequential deposition process. Thereafter, the processing pressure would be established by the flow rates of the process gases into process chamber 68. To that end, at step 200, substrate 10 is heated to a processing temperature within a range from about 250° C. to about 450° C. At step 202 the pump is activated to evacuate processing chamber 68 at a constant rate. At step 204, the TBTDET precursor is heated in ampoule 71a within a range from 65° C. to about 150° C. This forms a tantalum-containing gas that includes TBTDET. At step 206 a purge gas, such as argon, is flowed into processing chamber 68 for a sufficient time to purge processing chamber 68 and establish a processing pressure. The processing pressure is within a range from about 1 Torr to about 100 Torr. Although the exact time required is dependent upon the processing system employed, in the present example, the Ar is flowed into processing chamber 68 in the range from about 5 seconds to about 10 seconds.

At step 208 the tantalum-containing gas is flowed into processing chamber 68 along with Ar gas to create a tantalum-containing layer on substrate 10. The flow rates of the tantalum-containing gas and the Ar gas is established so as to prevent varying the processing pressure established at step 206. To that end, Ar gas from supply 70c is flowed into ampoule 71a at a rate of approximately 500 sccm. After about 5 seconds to about 25 seconds, the flow of tantalum-containing gas is terminated, with the flow of Ar increased to maintain the processing pressure, at step 210. This continues for a sufficient time to remove tantalum-containing gas and reaction byproducts from processing chamber 68, typically about 5 seconds to about 10 seconds. Subsequently at step 212, a nitrogen-containing gas, such as $NH_3$ gas, is introduced into processing chamber 68, along with the purge gas for a sufficient amount of time to react nitrogen, contained in the nitrogen-containing gas, with the tantalum-containing layer to form a tantalum nitride layer. The tantalum nitride layer may or may not be a monolayer of tantalum nitride molecules. The time required to achieve the nitrogen reaction depends upon the processing system employed. In the present example, the time is in the range from about 5 seconds to about 35 seconds. The flow rate of the $NH_3$ gas and the purge gas are established so that the processing pressure established at step 206 is maintained. The flow of the $NH_3$ process gas into processing chamber 68 is subsequently terminated, while the flow of purge gas is increased at step 214 to maintain a constant processing pressure. In this manner, the nitrogen-containing gas and byproducts of the nitrogen reaction with the tantalum-containing layer are removed from processing chamber 68. This completes one cycle of the sequential deposition technique in accordance with the present invention.

The aforementioned cycle is repeated multiple times until barrier layer 20 reaches a desired thickness shown in FIG. 2. As a result, at step 216, shown in FIG. 9, it is determined whether the tantalum nitride barrier layer has reached a desired thickness employing any known means in the art. Were it determined that tantalum nitride layer had not reached a desired thickness, and then the process would proceed to step 208. Were it determined that tantalum nitride layer had reached a desired thickness, and then the process would proceed with further processing at step 218. Generally, the tantalum nitride barrier layer is grown to a thickness in the range from about 10 Å to about 1,000 Å. An example of further processing could include formation of a copper layer 24, shown in FIG. 2, employing standard formation techniques, such as electroplating.

Figure 10:
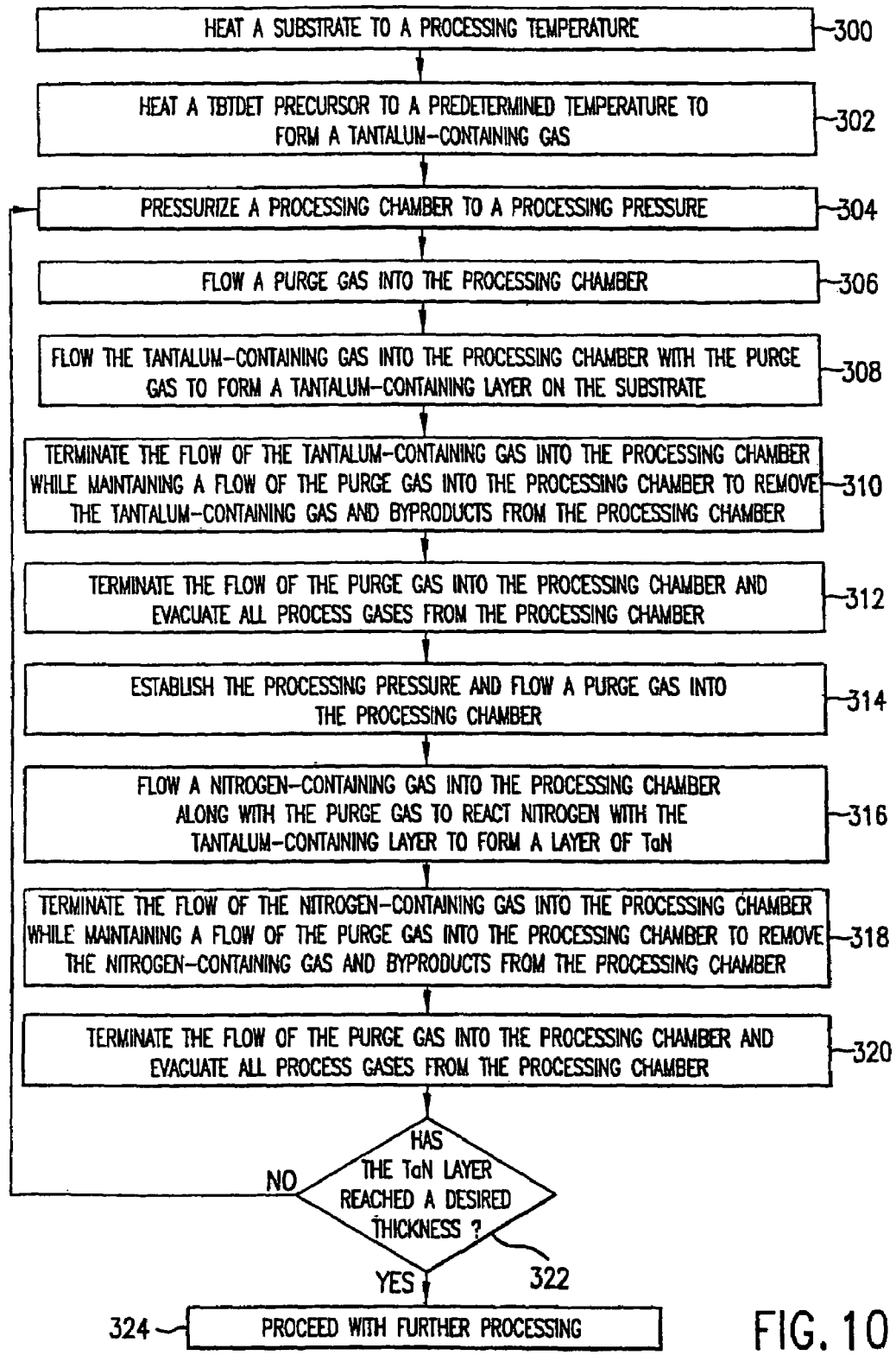
FIG. 10 is flow diagram showing a method of depositing a tantalum nitride layer, in accordance with one embodiment of the present invention.

Referring to FIGS. 7 and 10 in yet another embodiment of the present invention, removal of byproducts and precursors from processing chamber 68 may be achieved by evacuating processing chamber 68 of all gases present after formation of each tantalum-containing layer that is yet to under go a reaction with nitrogen. To that end, substrate 10 is heated to a processing temperature within a range from about 250° C. to about 450° C. at step 300, and the TBTDET precursor is heated in ampoule 71a within a range from about 65° C. to about 150° C. at step 302 to form a tantalum-containing gas that includes TBTDET. At step 304, vacuum pump 80 establishes a processing pressure within a range from about 1 Torr to about 100 Torr. At step 306 a purge gas, such as argon is flowed into processing chamber 68 for a sufficient amount of time to purge processing chamber 68. The time required to purge processing chamber 68 is dependent upon the processing system employed.

In the present example, the time required to purge processing chamber 68 is within a range from about 5 seconds to about 10 seconds. At step 308 the tantalum-containing gas is flowed into processing chamber 68 along with Ar gas to create a tantalum-containing layer on substrate 10. To that end, Ar gas from supply 70c is flowed into ampoule 71a at a rate of approximately 500 sccm. After a sufficient amount of time, the flow of tantalum-containing gas is terminated, while the flow of Ar continues. The amount of time during which the tantalum-containing gas flows is dependent upon the processing system employed.

In the present example the tantalum-containing gas is flowed into processing chamber 68 for approximately 5 seconds to about 25 seconds during step 310. During step 310, the flow of Ar gas into processing chamber 68 continues for a sufficient time to remove the tantalum-containing gas and reaction byproducts from processing chamber 68. The duration for which Ar gas is flowed into processing chamber 68 is dependent upon the processing system employed, but in the present example, is in the range from about 5 seconds to about 25 seconds.

Subsequently, at step 312 the flow of Ar gas is terminated and the processing chamber is evacuated of all gases present. At step 314 processing chamber 68 is brought to the processing pressure and the Ar gas is introduced therein. At step 316, the nitrogen-containing gas is introduced into processing chamber 68, along with the purge gas for a sufficient amount of time to react nitrogen in the nitrogen-containing gas with the tantalum-containing layer to form a layer of tantalum nitride. The time required to achieve the nitrogen reaction is dependent upon the processing system employed.

In the present example, the nitrogen-containing gas is flowed into processing chamber 68 in the range from 5 seconds to about 35 seconds during step 316. The flow of the tantalum-containing process gas into processing chamber 68 is subsequently terminated, while the flow of purge gas continues at step 318. In this manner, the tantalum-containing process gas and byproducts of the nitrogen reaction are removed from processing chamber 68. At step 320, the flow of Ar gas is terminated and the processing chamber is evacuated of all gases present therein at step 312. This completes one cycle of the sequential deposition technique in accordance with the present invention.

The aforementioned cycle is repeated multiple times until layer 14 reaches a desired thickness shown in FIG. 2. As a result, at step 322 it is determined whether the aforementioned tantalum nitride layer has reached a desired thickness employing any known means in the art. Were it determined that tantalum nitride layer had not reached a desired thickness, and then the process would proceed to step 304. Were it determined that tantalum nitride layer had reached a desired thickness, and then the process would proceed with further processing at step 324. An example of further processing could include formation of a copper layer 24, shown in FIG. 2, employing standard formation techniques, such as electroplating.

In some embodiments of the processes, tantalum nitride is formed with stoichiometry that includes $TaN_x$, were x is in the range from about 0.4 to about 2. Tantalum nitride is often derived with the empirical formulas TaN, $Ta_3N_5$, $Ta_2N$ or $Ta_6N_{2.57}$. Tantalum nitride is deposited as amorphous or crystalline material. In some metal nitrides, slight variations of the stoichiometry can have a large impact on the electrical properties, e.g., $Hf_3N_4$ is an insulator while HfN is a conductor. Therefore, ALD provides stoichiometric control during the deposition of product compounds. The stoichiometry may be altered by various procedures following the deposition process, such as when $Ta_3N_5$ is thermally annealed to form TaN. Altering the precursor ratios during deposition also controls stoichiometry.

Many industrial applications exist for the product compounds and materials formed by the various processes of the embodiments described. Within the microelectronics industry, the product compounds may be used as seed layers, diffusion barrier layers, adhesion layers, insulator layers, conducting layers or functionalized surface groups for patterned surfaces (e.g., selective deposition).

Although the invention has been described in terms of specific embodiments, one skilled in the art will recognize that various changes to the reaction conditions, e.g., temperature, pressure, film thickness and the like can be substituted and are meant to be included herein and sequence of gases being deposited. For example, sequential deposition process may have different initial sequence. The initial sequence may include exposing the substrate to the reducing gas before the metal-containing gas is introduced into the processing chamber. In addition, the tantalum nitride layer may be employed for other features of circuits in addition to functioning as a diffusion barrier for contacts. Therefore, the scope of the invention should not be based upon the foregoing description. Rather, the scope of the invention should be determined based upon the claims recited herein, including the full scope of equivalents thereof.

While the foregoing is directed to embodiments of the present invention, other and further embodiments of the invention may be devised without departing from the basic scope thereof, and the scope thereof is determined by the claims that follow.

The invention claimed is:

1. A method for forming a tantalum-containing material on a substrate, comprising:
   heating a substrate to a deposition temperature within a process chamber;
   heating an ampoule containing a tantalum precursor to a predetermined temperature within a range from about 50° C. to about 170° C. to form a tantalum precursor gas;
   flowing the tantalum precursor gas through a conduit and into the process chamber while maintaining the conduit at a temperature within a range from about 50° C. to about 170° C.; and
   exposing the substrate to at least sequential pulses of the tantalum precursor gas and a nitrogen precursor during an atomic layer deposition process to deposit a tantalum nitride material thereon.

2. The method of claim 1, wherein the predetermined temperature of the ampoule is within a range from about 65° C. to about 150° C.

3. The method of claim 2, wherein the temperature of the conduit is within a range from about 65° C. to about 150° C.

4. The method of claim 1, further comprising depositing a nucleation layer on the tantalum nitride material.

5. The method of claim 4, further comprising depositing a bulk layer on the nucleation layer.

6. The method of claim 5, wherein the bulk layer comprises copper.

7. The method of claim 1, further comprising depositing a bulk layer on the tantalum nitride material.

8. The method of claim 7, wherein the bulk layer comprises copper.

9. The method of claim 1, wherein the nitrogen precursor comprises a radical nitrogen compound.

10. The method of claim 9, wherein the radical nitrogen compound is produced by a plasma during the atomic layer deposition process.

11. The method of claim 1, wherein the nitrogen precursor is selected from the group consisting of nitrogen, ammonia, hydrazine, and azide.

12. The method of claim 10, wherein the radical nitrogen compound is selected from the group consisting of $N_3$, $N_2$, N, NH, and $NH_2$.

13. The method of claim 1, wherein the atomic layer deposition process further comprises a carrier gas of hydrogen.

14. The method of claim 10, wherein the tantalum precursor is a metal-organic precursor.

15. A method for forming a tantalum-containing material on a substrate, comprising:
   heating a substrate to a deposition temperature within a process chamber;
   heating an ampoule containing a tantalum precursor to a predetermined temperature within a range from about 50° C. to about 170° C. to form a tantalum precursor gas;
   flowing the tantalum precursor gas through a conduit and into the process chamber while maintaining the conduit at a temperature within a range from about 50° C. to about 170° C.;
   exposing the substrate to at least sequential pulses of the tantalum precursor gas and a nitrogen precursor during an atomic layer deposition process to deposit a tantalum nitride material thereon;
   depositing a nucleation layer on the tantalum nitride material; and
   depositing a bulk layer on the nucleation layer.

16. The method of claim 15, wherein the predetermined temperature of the ampoule is within a range from about 65° C. to about 150° C.

17. The method of claim 16, wherein the temperature of the conduit is within a range from about 65° C. to about 150° C.

18. The method of claim 15, wherein the nucleation layer comprises copper.

19. The method of claim 15, wherein the bulk layer comprises copper.

20. The method of claim 15, wherein the nitrogen precursor comprises radical nitrogen compound.

21. The method of claim 20, wherein the radical nitrogen compound is produced by a plasma during the atomic layer deposition process.

22. The method of claim 15, wherein the nitrogen precursor is selected from the group consisting of nitrogen, ammonia, hydrazine, and azide.

23. The method of claim 21, wherein the radical nitrogen compound is selected from the group consisting of $N_3$, $N_2$, N, NH, and $NH_2$.

24. The method of claim 15, wherein the atomic layer deposition process further comprises a carrier gas of hydrogen.

25. The method of claim 21, wherein the tantalum precursor is a metal-organic precursor.

26. A method for forming a tantalum-containing material on a substrate, comprising:
   heating a substrate to a deposition temperature within a process chamber;
   heating an ampoule containing a tantalum precursor to a predetermined temperature within a range from about 50° C. to about 170° C. to form a tantalum precursor gas;
   flowing the tantalum precursor gas through a conduit and into the process chamber while maintaining the conduit at a temperature within a range from about 50° C. to about 170° C.; and
   exposing the substrate to at least sequential pulses of the tantalum precursor gas and a nitrogen precursor during a plasma-enhanced atomic layer deposition process to deposit a tantalum nitride material thereon.

27. The method of claim 26, wherein the predetermined temperature of the ampoule is within a range from about 65° C. to about 150° C.

28. The method of claim 27, wherein the temperature of the conduit is within a range from about 65° C. to about 150° C.

29. The method of claim 26, further comprising depositing a nucleation layer on the tantalum nitride material.

30. The method of claim 29, further comprising depositing a bulk layer on the nucleation layer.

31. The method of claim 30, wherein the bulk layer comprises copper.

32. The method of claim 26, wherein the nitrogen precursor comprises a radical nitrogen compound.

33. The method of claim 26, wherein the nitrogen precursor is selected from the group consisting of nitrogen, ammonia, hydrazine, and azide.

34. The method of claim 32, wherein the radical nitrogen compound is selected from the group consisting of $N_3$, $N_2$, N, NH, and $NH_2$.

35. The method of claim 26, wherein the atomic layer deposition process further comprises a carrier gas of hydrogen.

36. The method of claim 35, wherein the tantalum precursor is a metal-organic precursor.

37. A method for forming a tantalum-containing material on a substrate, comprising:
   heating a substrate to a deposition temperature within a process chamber;
   heating an ampoule containing a metal-organic tantalum precursor to a predetermined temperature within a range from about 50° C. to about 170° C. to form a tantalum precursor gas;
   flowing the tantalum precursor gas through a conduit and into the process chamber while maintaining the conduit at a temperature within a range from about 50° C. to about 170° C.; and
   exposing the substrate to at least sequential pulses of the tantalum precursor gas and a radical nitrogen compound during a plasma-enhanced atomic layer deposition process to deposit a tantalum nitride material thereon.

38. A method for forming a tantalum-containing material on a substrate comprising:
   heating a substrate to a deposition temperature within a process chamber;
   heating an ampoule containing a metal-organic tantalum precursor to a predetermined temperature within a range from about 50° C. to about 170° C. to form a tantalum precursor gas;
   flowing the tantalum precursor gas through a conduit and into the process chamber while maintaining the conduit at a temperature within a range from about 50° C. to about 170° C.;
   exposing the substrate to at least sequential pulses of the tantalum precursor gas and a radical nitrogen compound during a plasma-enhanced atomic layer deposition process to deposit a tantalum nitride material thereon;
   depositing a nucleation layer on the tantalum nitride material; and
   depositing a bulk layer on the nucleation layer.

* * * * *

UNITED STATES PATENT AND TRADEMARK OFFICE
CERTIFICATE OF CORRECTION

PATENT NO. : 7,514,358 B2  Page 1 of 1
APPLICATION NO. : 11/231386
DATED : April 7, 2009
INVENTOR(S) : Cao et al.

It is certified that error appears in the above-identified patent and that said Letters Patent is hereby corrected as shown below:

Title Page In the References Cited (56):

Please delete "2004/0078723 A1 4/2004 Gross et al." and insert --2004/0018723 A1 1/2004 Byun et al.-- therefor.

Signed and Sealed this

Sixteenth Day of June, 2009

JOHN DOLL
*Acting Director of the United States Patent and Trademark Office*